United States Patent
Kiehl

(10) Patent No.: US 6,914,851 B1
(45) Date of Patent: Jul. 5, 2005

(54) CIRCUIT ELEMENT WITH TIMING CONTROL

(75) Inventor: Oliver Kiehl, Charlotte, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/620,092

(22) Filed: Jul. 15, 2003

(30) Foreign Application Priority Data

Jul. 15, 2002 (DE) .......................................... 102 31 954

(51) Int. Cl.[7] ................................................ G11C 8/00
(52) U.S. Cl. ................................. 365/233; 365/230.08
(58) Field of Search ............................. 365/233, 230.08

(56) References Cited

U.S. PATENT DOCUMENTS

| | | | | |
|---|---|---|---|---|
| 4,788,492 A | * | 11/1988 | Schubert ..................... 714/724 |
| 5,341,341 A | * | 8/1994 | Fukuzo ....................... 365/233 |
| 5,418,924 A | | 5/1995 | Dresser ....................... 713/600 |
| 5,715,655 A | | 2/1998 | Söderberg .................... 53/441 |
| 5,751,655 A | | 5/1998 | Yamazaki et al. |
| 6,154,821 A | | 11/2000 | Barth et al. ................. 711/170 |

FOREIGN PATENT DOCUMENTS

DE 43 07 564 A1 3/1994

* cited by examiner

*Primary Examiner*—M. Tran
(74) *Attorney, Agent, or Firm*—Laurence A. Greenberg; Werner H. Stemer; Ralph E. Locher

(57) ABSTRACT

A circuit element has an input for receiving an external clock with a clock period duration. A unit is provided to present the circuit element with information representing the clock period duration of the external clock. In addition the circuit element includes a unit for the temporal control of a signal in the circuit element on the basis of information representing the clock period duration.

8 Claims, 3 Drawing Sheets

| fCK MHz | Factor | MRS | tCK tCK | tRAS (34) | Actual min. | Actual max. | Error ns | F_examp MHz | Description | T_examp | TRAS nom |
|---|---|---|---|---|---|---|---|---|---|---|---|
| 118.00 | 1.00 | 1 | 8.47 | 5 | 40.4 | 42.4 | 8.4 | 125.00 | MIN | 8.00 | 40.00 |
| 123.90 | 1.05 | 2 | 8.07 | 5 | 38.4 | 40.4 | 6.4 | | | | |
| 130.10 | 1.10 | 3 | 7.69 | 5 | 36.6 | 38.4 | 4.4 | | | | |
| 136.60 | 1.16 | 4 | 7.32 | 5 | 34.9 | 36.6 | 2.6 | | | | |
| 143.43 | 1.22 | 5 | 6.97 | 6 | 39.8 | 41.8 | 7.8 | | | | |
| 150.60 | 1.28 | 6 | 6.64 | 6 | 37.9 | 39.8 | 5.8 | | | | |
| 158.13 | 1.34 | 7 | 6.32 | 6 | 36.1 | 37.9 | 3.9 | 166.67 | DDR2-333 | 6.00 | 36.00 |
| 166.04 | 1.41 | 8 | 6.02 | 6 | 34.4 | 36.1 | 2.1 | | | | |
| 174.34 | 1.48 | 9 | 5.74 | 7 | 38.2 | 40.2 | 6.2 | | | | |
| 183.06 | 1.55 | 10 | 5.46 | 7 | 36.4 | 38.2 | 4.2 | 200.00 | DDR2-400 | 5.00 | 35.00 |
| 192.21 | 1.63 | 11 | 5.20 | 7 | 34.7 | 36.4 | 2.4 | | | | |
| 201.82 | 1.71 | 12 | 4.95 | 8 | 37.8 | 39.6 | 5.6 | | | | |
| 211.91 | 1.80 | 13 | 4.72 | 8 | 36.0 | 37.8 | 3.8 | | | | |
| 222.51 | 1.89 | 14 | 4.49 | 8 | 34.2 | 36.0 | 2.0 | | | | |
| 233.63 | 1.98 | 15 | 4.28 | 9 | 36.7 | 38.5 | 4.5 | | | | |
| 245.31 | 2.08 | 16 | 4.08 | 9 | 34.9 | 36.7 | 2.7 | 266.67 | DDR2-533 | 3.75 | 37.50 |
| 257.58 | 2.18 | 17 | 3.88 | 10 | 37.0 | 38.8 | 4.8 | | | | |
| 270.46 | 2.29 | 18 | 3.70 | 10 | 35.2 | 37.0 | 3.0 | | | | |
| 283.98 | 2.41 | 19 | 3.52 | 11 | 36.9 | 38.7 | 4.7 | | | | |
| 298.18 | 2.53 | 20 | 3.35 | 11 | 35.1 | 36.9 | 2.9 | | | | |
| 313.09 | 2.65 | 21 | 3.19 | 12 | 36.5 | 38.3 | 4.3 | 333.33 | DDR2-667 | 3.00 | 36.00 |
| 328.74 | 2.79 | 22 | 3.04 | 12 | 34.8 | 36.5 | 2.5 | | | | |
| 345.18 | 2.93 | 23 | 2.90 | 13 | 35.9 | 37.7 | 3.7 | | | | |
| 362.44 | 3.07 | 24 | 2.76 | 13 | 34.2 | 35.9 | 1.9 | | | | |
| 380.56 | 3.23 | 25 | 2.63 | 14 | 35.0 | 36.8 | 2.8 | 400.00 | DDR2-800 | 2.50 | 37.50 |
| 399.59 | 3.39 | 26 | 2.50 | 15 | 35.8 | 37.5 | 3.5 | | | | |
| 419.57 | 3.56 | 27 | 2.38 | 15 | 34.0 | 35.8 | 1.8 | | | | |
| 440.55 | 3.73 | 28 | 2.27 | 16 | 34.6 | 36.3 | 2.3 | | | | |
| 462.58 | 3.92 | 29 | 2.16 | 17 | 35.0 | 36.8 | 2.8 | | | | |
| 485.70 | 4.12 | 30 | 2.06 | 18 | 35.3 | 37.1 | 3.1 | | | | |
| 509.99 | 4.32 | 31 | 1.96 | 19 | 35.5 | 37.3 | 3.3 | | | | |

FIG. 2

CIRCUIT ELEMENT WITH TIMING CONTROL

FIELD OF THE INVENTION

The present invention relates to a circuit element with timing control and in particular to such a circuit element which receives an external clock with a clock frequency and an associated clock period duration. The present invention can be used to advantage particularly in the area of memory elements, e.g. DRAM elements (DRAM=dynamic random access memory).

BACKGROUND OF THE INVENTION AND PRIOR ART

Present day DRAM memory elements contain a plurality of chip-internal timers, i.e. on-chip timers, which control different processes running on the DRAM element. Each of these timers is subject to inaccuracies, chip area consumption and the need for standby power. Since present day DRAM memory elements are specified to operate in a wide frequency range, e.g. from 83 MHz to 167 MHz, the clock supplied to the memory element from the outside cannot be used as a time basis for the control of internal processes. In particular the external clock cannot be used to ascertain particular time periods which must be controlled on the DRAM element itself, e.g. the time tRAS, which represents the time between the moment when a row (word line) is activated and the moment when this row can be precharged (closed). Another example is the time between the moment when data are written to an open row and the moment when this row should be closed; the time here is termed tWR.

Traditional DRAM elements normally contain chip-internal analog timer circuits to create the necessary delays, e.g. tRAS or tWR. As has been explained above, these timers must not use the externally provided clock as a time basis since the DRAM elements should be useable at different clock frequencies.

Alternative approaches have proved to be unsuitable. Such approaches include e.g. the addition of a bit line supervisor to monitor the reset voltages, but the required chip area is too large. On the other hand, the addition of a dummy bit line as reference leads to a high power consumption. Furthermore, the generation of a delay which exactly fulfils a necessary specification is too difficult to implement.

Registers have also been proposed which enable the memory control to report precisely the number of clock cycles which satisfy e.g. tRAS or TWR at the current operating frequency. This approach requires a register per timer and is therefore of no use for controlling all the timers. Also, with this approach, all the timers must be specified externally, which is not possible since not all the memory elements which satisfy a standard necessarily have the same timer structure.

As a result, today's DRAM memory elements or memory chips use independent analog delay elements to realize the above delay times, e.g. tRAS and tWR.

SUMMARY OF THE INVENTION

It is the object of the present invention to provide a device for the temporal control of at least one signal in a circuit element, which enables a compromise to be made between power consumption and accuracy.

The present invention provides a circuit element comprising:

an input for receiving an external clock with a clock period duration;
a unit for providing the circuit element with information representing the clock period duration of the external clock; and
a unit for the temporal control of at least one signal in the circuit element based on the information representing the clock period duration.

The present invention utilizes the knowledge of the clock period or the frequency of a clock signal applied externally to a circuit element in order to control exactly on this basis at least one signal in the circuit element. To this end the data indicating the clock period duration of an external clock signal are preferably stored in a memory on the circuit element, for preference a register. Preferably the circuit element also has nominal time information stored or hard-wired on it representing e.g. the specification of a predetermined delay. A timing element then uses the stored clock frequency information and the nominal time information to determine by how many clock cycles or fractions of clock cycles of the external clock signal the signal to be controlled should be delayed to achieve a specification specified by the nominal time information and to adjust the delay of a delay element in accordance with the determined clock cycles or fractions of clock cycles.

Based on the clock frequency information available according to the present invention to the circuit element, the externally provided clock signal and nominal time information optionally available on the circuit element, according to the present invention all the signals employed on the circuit element can be temporally controlled. Apart from the specification of delay times mentioned above, this control can also include the control of the instants at which control signals in general are evoked, the duration of the same and suchlike.

In preferred embodiments the circuit element according to the present invention constitutes a memory element, e.g. a DRAM element. In preferred embodiments the DRAM element includes a register into which a value is written which represents the clock frequency and thus the clock period of an external clock signal which is supplied to the memory element. This value can be written into the register using either a chip-external or a chip-internal control. Once the value has been stored, the memory element can calculate the respective number of clock cycles needed to obtain the time instants, the time durations or the delay times which are required for internal operations and which fulfil specifications. In addition the knowledge of the clock frequency and thus of the clock period can be used to calibrate a delay component of the memory element. e.g. of the DRAM element. To reduce inaccuracies due to rounding, the memory element can employ a delay-locked loop or a phase-locked loop so as to subdivide the clock period into smaller time intervals.

Further developments of the present invention are presented in the dependent claims.

BRIEF DESCRIPTION OF THE DRAWINGS

Preferred embodiments of the present inventions are described in more detail below making reference to the enclosed drawings, in which

FIG. 2 shows a table for better understanding of the present invention;

DETAILED DESCRIPTION OF PREFERRED EMBODIMENTS

Figure 1:
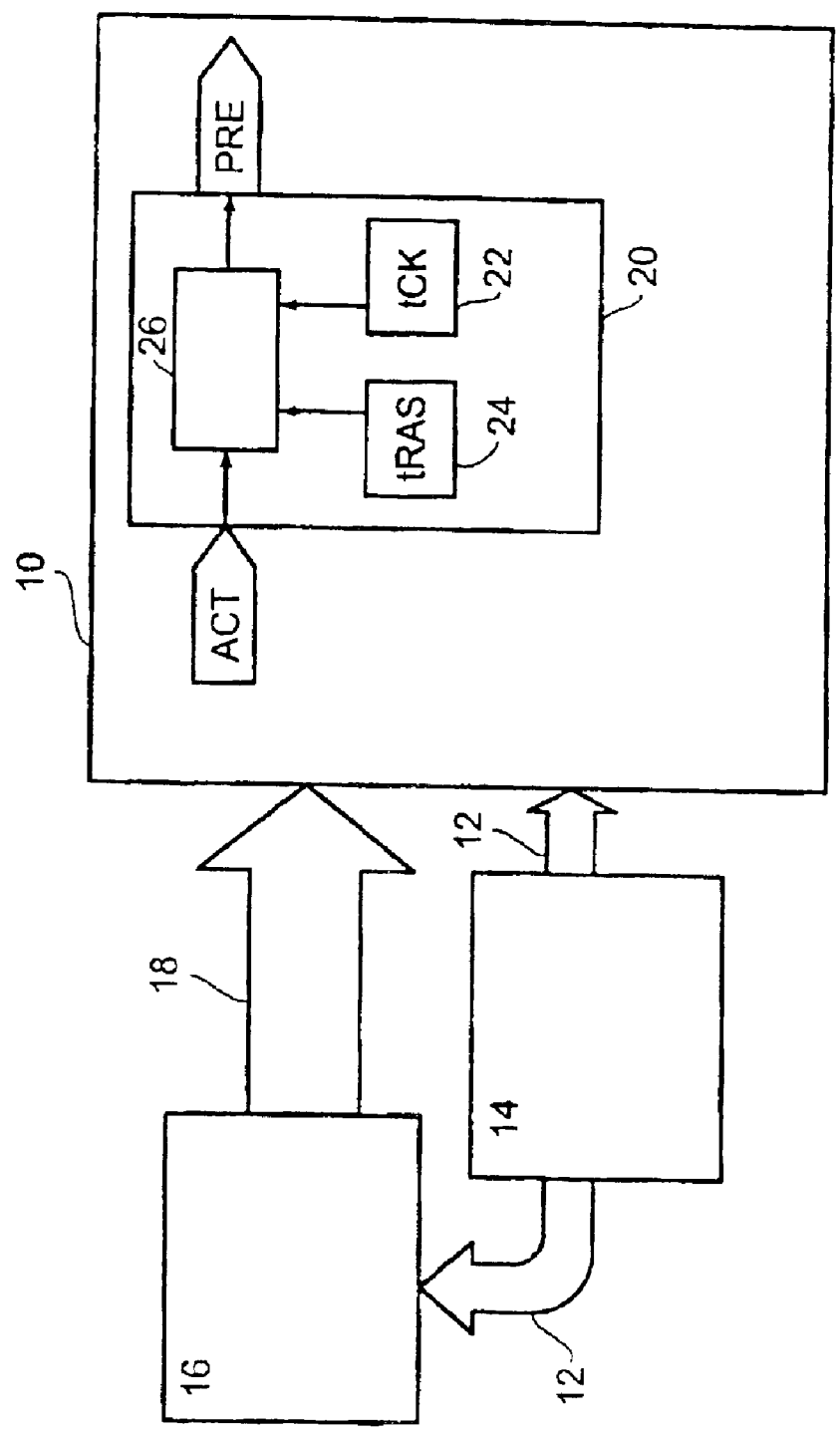
FIG. 1 shows a schematic representation of an embodiment of a circuit element according to the present invention.

FIG. 1 shows a memory element 10, e.g. a DRAM element. The memory element 10 might also take the more specialized form of a DDR-SDRAM element (DDR SDRAM=double data rate synchronous dynamic random access memory).

The memory element 10 receives a clock signal 12 from a clock generator 14. The clock signal represents an external clock signal and possesses a certain clock frequency. Typical clock frequencies lie in a range between 83 MHz and 167 MHz. The clock generator 14 also supplies the clock signal 12 to an external control 16. The control 16 is connected to the memory element 10 via a signal bus 18, which is usually called the CMD bus. The memory element 10 can be a memory module with a plurality of memory chips on it or a single memory chip.

The control 16 communicates with the memory element 10 via the signal bus 18 so as to transfer control signals and data signals to the memory element 10 and to receive them from it.

So far the structure of the memory element 10, clock generator 14 and control 16 described above corresponds to a traditional structure.

However, the memory element according to the present invention differs from traditional memory elements in respect of a timing control 20 for the temporal control of signals in the memory element, in the example shown so as to delay an activation signal ACT in order to generate from it the internal precharging signal PRE. The activation signal ACT is supplied to the memory element externally, usually from the memory control 16 over the CMD bus 18.

The timing control 20 includes a memory area or a register 22 in which the period duration tCK of the external clock 12 is stored. In addition a memory area 24 is provided in which a nominal delay time tRAS is stored which shows by how much the activation signal ACT must be delayed before it may be issued or let through as the precharging signal PRE so as to comply with the specification of the memory element 10.

The timing control 20 also includes a timing element 26, which combines the stored period duration tCK and the nominal delay time so as to ascertain by how many clock cycles or fractions of clock cycles of the external clock signal 12 the activation signal ACT must be delayed to achieve a delay time which is at least equal to tRAS. For this purpose the timing element includes in the simplest case a suitable combination circuit, which combines the period duration tCK and the nominal delay time tRAS so as to ascertain how many clock cycles of the external clock signal are necessary to realize the nominal delay time, and a delay element or a digital timer controlled by the combination circuit to delay the activation signal by the corresponding number of clock cycles of the external clock signal which is supplied to the delay element and to issue this signal, or let it pass, as the precharging signal PRE subsequent to this delay.

Data representing the period duration of the external clock signal 12 are communicated to the memory element 10 by the memory control and stored in the clock period duration register 22 before any actual memory operations are performed. An example of how these data might be structured will now be explained in some detail making reference to FIG. 2.

In operation the memory element 10 therefore knows the clock period of the external clock signal 12 from the data stored in register 22 so that the timing element 26 can be realized using simple combinatorial logic. From the data stored in the period duration register 22 and the time information for tRAS known from the memory unit 24, the number of clock periods needed for tRAS is ascertained in order to control a delay element so that only after waiting for the ascertained number of clock periods is the activation signal ACT let through as the precharging signal PRE. The timing element 26 thus controls the output of the signal PRE on the basis of the information representing the clock period and stored in the period duration register 22.

In connection with ascertaining the number of clock periods for tRAS, the table shown in FIG. 2 should be referred to. The first column of the table represents the clock frequency fCK of the clock signal 12, where fCK=1/tCK, and the second column of the table represents a multiplication factor by which the clock frequency of 118.00 MHz must be multiplied to give the clock frequency fCK in the respective line.

The third column of the table contains the data MRS stored in the clock period duration register 22. In the present case a five-bit register is used, so MRS can adopt thirty two different values. A value 0 (not shown in the table) might e.g. indicate that no valid clock frequency information or clock period duration information has been received from the control. A value of 1 represents an external clock frequency fCK between 118 MHz and 123.90 MHz, while a value of 20 stands for a clock frequency fCK between 298.18 MHz and 313.09 MHz. In this way the frequency range from 118 MHz to 509.99 MHz is quantized into thirty one intervals, the size of the intervals increasing with increasing frequency.

The fourth column of the table in FIG. 2 shows the associated period duration tCK in ns. In the subsequent fifth column it can be seen how many clock periods are necessary to realize a delay time tRAS of 34 ns. The next two columns indicate for each interval the minimal and maximal actual time for tRAS resulting from the number of period durations used. For example, in the interval from 118.00 MHz to 123.90 MHz the minimal actual time for tRAS is 40.4 ns and the maximal actual time is 42.4 ns. The next, eighth column shows the maximal error in ns which results from the difference between the actual maximal time tRAS and the minimal ideal value, 34 ns in the present case.

Examples of frequencies employed in actual memory implementations are shown in the column Fexamp, and the customary designations of these are given in the next column with the heading Name. Finally, the last two columns of the table give the period durations Texamp and the nominal time tRAS obtained according to the present invention for the six examples.

The accuracy of the actual value of tRAS derived according to the present invention depends in part on the number of bits of the clock period duration register and in part on the size of the clock period itself. The greater the number of bits of the clock period duration register, the smaller can be the respective frequency intervals to each of which an entry is assigned in the register, so that the error of the actual value of tRAs in relation to the minimal optimal value of the same decreases accordingly. The accuracy of the method used according to the present invention increases with increasing magnitude of the clock period since the rounding error is thereby reduced, as can be seen clearly from the error values shown in the eighth column of the table in FIG. 2.

The respective actual value of tRAS depends on the characteristic of the memory element. The actually realized values of tRAS shown in FIG. 2 are obtained in the case where only whole clock periods are used.

The accuracy can be improved by adding further bits to the clock period duration register 22.

Alternatively, the accuracy can be improved by equipping the timing element 26, which according to the present invention is preferably digitally implemented, with a time subdivision unit.

Figure 3:
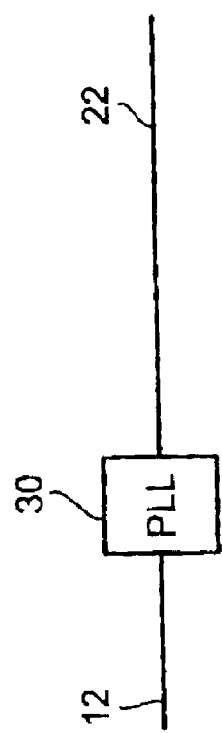
FIG. 3 shows a schematic representation of a phase-locked loop capable of being used according to the present invention.

For example, a time subdivision can be achieved by means of a phase-locked loop (PLL) through which the external clock 12 is reproduced many times, thus generating a finer time basis. Thus a PLL 30 can generate a faster clock 32 from the external clock 12, as shown in FIG. 3, to generate a clock with a divided clock period. The timing element 26 then delays not by whole multiples of the external clock period but by whole multiples of the divided external clock period. The clock frequency of the fast clock 32 might e.g. be eight times the clock frequency of the external clock frequency 12, so that through this internal generation of a multiple of the external clock frequency the accuracy of the timing control 20 can be improved considerably, so that the error which occurs is reduced accordingly.

Figure 4:
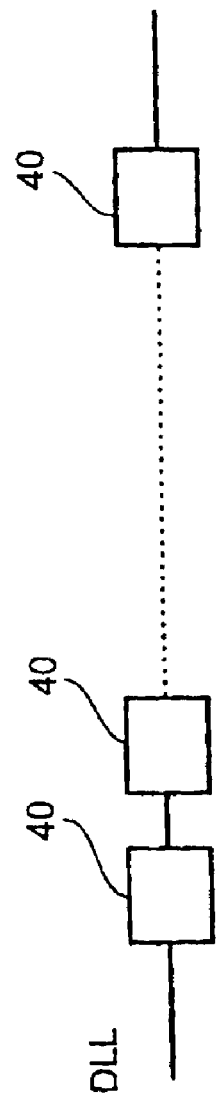
FIG. 4 shows a schematic representation of a delay-locked loop capable of being used according to the present invention.

A similar result can be achieved if a delay-locked loop (DLL) consisting of a plurality of standard delay elements or reference delay elements is provided. With the aid of the DLL the scattered delay of a standard delay element 40 (FIG. 4) due to production and operating parameters can be compared with the clock period of the external clock signal. If the delay element of the timing element 26 is now constructed from copies of these standard delay elements, the timing element can ascertain the number of standard elements 40 which must be activated in order to achieve the delay needed to satisfy the nominal time specification.

The comparison of a series of reference delays with the clock period performed in such a DLL results in a very precise step value for the timing control 20 when the clock period is known. When the actual timing control has the same delay elements, the number of elements necessary for a given operation, e.g. a given delay time tRAS, can be calculated simply. In this way the rounding errors can be reduced to a fraction of a ns.

Within the framework of the description above the use of the present invention to ascertain the time tRAS has been described, tRAS being the time from the moment of activation of a row to the moment when this row can be precharged. If a fast autoprecharge or RAS lockout feature is activated, a Read-AP instruction can be imparted to the memory element before the time tRAS has elapsed. In this case it is the task of the memory element to find the right time to automatically precharge the row. This time must be within the specification and must also enable the row information to be restored completely. According to the present invention this right time can be ascertained by the timing element 26 according to the specification of the memory element (stored in the nominal value memory 24) and the knowledge of the external clock frequency (stored in the clock period duration register 22).

Summarizing, in the implementation described above, the control 16 determines the number (1 to 31 in the table of FIG. 2) which represents the clock period (and thus the clock frequency) of the clock signal 12 with which the memory element is actually operated. This number is communicated to the DRAM memory element 10 over the command bus and is there stored, as has been described above, in the period duration register, which may be a field of a mode register. The memory element then ascertains, from the number stored in the mode register and respective internal times, e.g. tRAS, a number of clock periods or partial clock periods ascertained from the clock periods if a DLL or a PLL is employed, in order to control on this basis a preferably digital delay element.

The principle described above in respect of the time tRAS can be used to control signals of all kinds in the circuit element or memory element.

For example, the principle can be used to ascertain tWR, i.e. the time which must elapse before a row can be closed after a write operation. Normally a read or write instruction with "autoprecharge" is received by a DRAM element and the element performs an internal precharge at time tWR after the read/write instruction. This time tWR can again, according to the explanation above, be ascertained by ascertaining an assigned number of clock periods, the period duration stored in the clock frequency register 22 being known.

Furthermore, the present invention can be used advantageously in the case of self refresh. For example, a DRAM must execute an autorefresh instruction within predetermined intervals in order to perform a self refresh. In normal operation the memory control or the memory controller must present this autorefresh instruction to the memory externally. A typical interval for performing such a refresh is 7.8 $\mu$s. In the self refresh mode the DRAM memory must generate an internal autorefresh instruction internally every 7.8 $\mu$s. The self refresh mode is activated after an SRF instruction has been received from the control, after which the external clock can be disconnected. Until now a corresponding autorefresh instruction was generated every 7.8 $\mu$s with the aid of an analog timer. According to the present invention the memory element calibrates an analog timer with the knowledge of the clock period stored in the clock period duration register. Thus the respective time for the autorefresh instruction, i.e. tREFRESH, can be ascertained more exactly. The invention can also be used to control the instants for a staggered refresh of a plurality of independent memory banks with a single autorefresh command. This enables refresh current peaks to be reduced and the internal voltage generator system can be made smaller, thus economizing on rest current and chip area.

In addition to the above examples tRAS, tWR, tREFRESH and tRFC the present invention can be used to control internal signals of all kinds in a circuit element and in particular in a memory element.

Apart from the register for storing the clock frequency information or clock period information described above, the corresponding information can also be made available on the circuit element in other ways. For example, it is possible to program the desired time (e.g. tRAS) with laser fuses or some other non-volatile storage method during the manufacturing process. In a final process step during manufacture memory elements which have hitherto been manufactured identically can be adjusted for different speed classes.

Additionally, it is possible to provide a further register into which the memory control writes the speed class information. With only a few registers it is then possible for many or all timers, i.e. timing elements, of a memory element to be retarded or accelerated in that delay elements of the same are controlled in the light of the chosen speed class information and the external clock which is actually used.

In already existing memory modules (DIMMs) there is an EEPROM in which various time constants which are characteristic for a DRAM and which are guaranteed by the manufacturer are stored. This EEPROM is inscribed by the manufacturer after the final test. In present systems, however, the memory chip or memory element has no knowledge of the content of this EEPROM. The register referred to above offers the memory control the possibility of communicating the values read out of the EEPROM, e.g. the speed class, to the memory chip since they can be written into this register. The memory chip can then adjust the internal timing elements or timers adequately using this information.

What is claimed is:

1. Circuit element comprising:
   an input for receiving an external clock with a clock period duration;
   an unit for providing the circuit element with information representing the clock period duration of the external clock; and
   a unit for the temporal control of at least one signal in the circuit element on the basis of the information representing the clock period duration.

2. Circuit element according to claim 1, wherein the unit for the temporal control of the at least one signal on the basis of the information representing the clock period duration and on nominal time information ascertains a number of clock cycles or fractions of clock cycles of the external clock by which the input signal is to be delayed so as to control temporally the at least one signal.

3. Circuit element according to claim 1, wherein the unit for providing the information representing the clock period duration of the external clock includes a memory for storing data representing a clock period assigned to a clock frequency.

4. Circuit element according to claim 3, wherein the memory includes a register with a given number of data bits.

5. Circuit element according to claim 1, wherein the unit for the temporal control of the at least one signal has a phase-locked loop for generating a multiple of the external clock frequency in the circuit element.

6. Circuit element according to claim 1, wherein the unit for the temporal control of the at least one signal has a delay-locked loop (DLL) for adjusting a delay on the basis of the clock frequency information provided.

7. Circuit element according to claim 1, wherein the circuit element is a memory element.

8. Circuit element according to claim 7, wherein the signal is a precharge signal and/or a refresh signal.

* * * * *